United States Patent
Mallet

(10) Patent No.: US 8,150,663 B2
(45) Date of Patent: Apr. 3, 2012

(54) PARTITIONING ALGORITHM FOR BUILDING A STRATIGRAPHIC GRID

(75) Inventor: Jean-Laurent Mallet, Belgique (BE)

(73) Assignee: Paradigm Geophysical (Luxembourg) S.A.R.L., Luxembourg (LU)

( * ) Notice: Subject to any disclaimer, the term of this patent is extended or adjusted under 35 U.S.C. 154(b) by 1017 days.

(21) Appl. No.: 11/729,980

(22) Filed: Mar. 30, 2007

(65) Prior Publication Data

US 2008/0243454 A1     Oct. 2, 2008

(51) Int. Cl.
G06G 7/48     (2006.01)

(52) U.S. Cl. ............... 703/6; 703/10; 367/73; 367/38; 702/12; 702/10; 702/13; 702/16; 345/420; 345/428; 345/423; 345/582

(58) Field of Classification Search ............ 703/10; 702/2, 13, 14; 345/420, 419; 324/334
See application file for complete search history.

(56) References Cited

U.S. PATENT DOCUMENTS

| | | | |
|---|---|---|---|
| 4,821,164 A | 4/1989 | Swanson | |
| 4,991,095 A | 2/1991 | Swanson | |
| 5,321,612 A * | 6/1994 | Stewart | 702/13 |
| 5,844,564 A | 12/1998 | Bennis et al. | |
| 6,480,790 B1 * | 11/2002 | Calvert et al. | 702/14 |
| 6,907,392 B2 | 6/2005 | Bennis et al. | |
| 7,047,165 B2 | 5/2006 | Balaven | |
| 7,412,363 B2 | 8/2008 | Callegari | |
| 7,711,532 B2 | 5/2010 | Dulac | |
| 2003/0132934 A1 | 7/2003 | Fremmings | |
| 2005/0015231 A1 * | 1/2005 | Edwards et al. | 703/10 |
| 2005/0114831 A1 | 5/2005 | Callegari et al. | |
| 2005/0125203 A1 | 6/2005 | Hartman | |
| 2006/0197759 A1 | 9/2006 | Fremming | |
| 2006/0235666 A1 | 10/2006 | Assa | |
| 2007/0265815 A1 * | 11/2007 | Couet et al. | 703/10 |
| 2008/0154505 A1 * | 6/2008 | Kim et al. | 702/2 |

FOREIGN PATENT DOCUMENTS

WO     WO/03050766     6/2003

OTHER PUBLICATIONS

International Search Report and Written Opinion of Application PCT/IB2008/003339 mailed on Mar. 30, 2009.
Geomodeling, by J.L. Mallet, Oxford University Press, 2002, pp. 122-134.
Curves and Surfaces for CAGD: a practical guide, fifth edition, by G. Farin, Academic Press, 2002, 15, p. 269 to 284.
Jean-Laurent Mallet, Space-Time Mathematical Framework for Sedimentary Geology, Mathematical Geology, vol. 36, No. 1, 2004, p. 1-32.

(Continued)

*Primary Examiner* — Kamini S Shah
*Assistant Examiner* — Cuong Luu
(74) *Attorney, Agent, or Firm* — Pearl Cohen Zedek Latzer, LLP

(57) ABSTRACT

Embodiments of the invention provide a system and method for partitioning data for modelling a geological structure including laterally partitioning the data into multiple columns, where each column may be substantially laterally centered about a dual fiber and vertically partitioning each column at each of multiple intersection points of multiple surfaces and the dual fiber about which the column may be substantially laterally centered.

20 Claims, 18 Drawing Sheets

OTHER PUBLICATIONS

Jean-Laurent Mallet, Piecewise Linear Triangulated Surfaces, Geomodeling, Oxford University Press 2002, Chapter 6, p. 245-315.
Francois Lepage, Generation de Maillages Tridimensionnels Pour la Simulation des Phenomenes Physiques en Geosciences, Ecole National Superieure de Geologie, Oct. 2003, p. 1-224.
David Ledez, Modelisation D'Objets Naturels par Formulation Implicite, Ecole National Superieure de Geologie, Oct. 2003, p. 1-158.
X. H. Wen et al, Use of Border Regions for Improved Permeability Upscaling, Mathematical Geology, vol. 35, No. 5, Jul. 2003, p. 521-547.
Toyofumi Saito et al, New Algorithms for Euclidean Distance Transformation of an n-Dimensional Digitized Picture with Applications, Pattern Recognition, vol. 27, No. 11, 1994, p. 1551-1565.
Olivier Cuisenaire, Distance Transformations: Fas Algorithms and Applications to Medical Image Processing, Laboratoire de Telecommunications et Teledetection, Oct. 1999, p. 1-223.
Jones C B, Data Structures for Three-Dimensional Spatial Information Systems in Geology, Int. J. of Geographical Information Systems, London GB, vol. 3, No. 1, 1989, p. 15-31.
Cignoni P. et al, Multiresolution Representation and Visualization of volume Data, IEEE Transaction on Visualization and Computer Graphics, IEEE Service Center, Piscataway, NJ, US, vol. 3, No. 4, Oct. 1997, p. 352-369.
Office Action issued in U.S. Appl. No. 11/628,559, filed Jun. 24, 2009.
International Search Report issued in PCT/IB2004/002030, on Jan. 18, 2005.
Jean-Laurent Mallet, Discrete Smooth Interpolation in Geometric Modelling, Journal of Computer Aided Design, 1992, vol. 24., No. 4, p. 178-190.
Lixin W., Topographical Relations Embodied in a Generalized Tri-Prism (GTP) Model for a 3D Geoscience Modeling System, Computers & Geosciences, vol. 30, Iss. 4, May 2004, p. 405-418.
Courrioux et al. G. 3D Volmetric Modeling of Cadomain Terranes (Northern Brittany, France) An Automatic Method Using Voronoi Diagrams, Tectonophysics, vol. 331, Iss. 1-2, Feb. 2001, p. 181-196.
Notice of Allowance issued in U.S. Appl. No. 11/628,559, filed Dec. 24, 2009.

* cited by examiner

PRIOR ART

Horizons are extrapolated continuously across a fault
740

PARTITIONING ALGORITHM FOR BUILDING A STRATIGRAPHIC GRID

FIELD OF THE INVENTION

The invention pertains to the general field of modelling stratified terrains in the subsurface. More precisely, for the purpose of simulating flow through geological terrains, a new method of partitioning a geological domain into a plurality of hexahedral three-dimensional (3D) cells (e.g., referred to as "stratigraphic cells"), which may conform to the orientation of horizons and may approximate faults, is proposed. The stratigraphic cells may be generated using a partitioning algorithm (e.g., referred to as a "dual cookie cutter" algorithm) that may generate hexahedral cells having angles that approximate right angles and faces that approximate fault surfaces, for example, in a stair stepped way, regardless of the complexity of the horizons and/or faults.

BACKGROUND OF THE INVENTION

For the sake of clarity, the following preliminary definitions ate given. Other definitions may be used.

Horizons, Faults and Unconformities

In stratified layers, horizons, unconformities, and faults may be curvilinear surfaces which may be for example characterized as follows. A horizon H(t) may be a surface corresponding to a plurality of particles of sediment deposited, approximately, at substantially the same geological time or range of time (t). A fault may be a surface of discontinuity of the terrains that may have been induced by a relative displacement of terrains on both sides of such surfaces. Typically, faults may cut horizons and also cut other faults. An unconformity may be a surface of discontinuity along a horizon that may have been induced by an erosion of old terrains replaced by new ones. When discussed herein, unconformities are treated as faults: as a consequence, in the following faults must be understood as either real faults or unconformities.

Reference Horizons

The studied geological domain may be characterized by a series of surfaces referred to as "reference horizons" {H(t(1)), H(t(2)), . . . , H(t(N))}, which may separate layers of modelled data having significantly distinct physical properties and may be associated with pseudo geological times of deposition {t(1), t(2), . . . , t(N)}, respectively. "Pseudo geologic time" may refer to a parameter which may be an arbitrary monotonic increasing function of real (e.g., generally unknown) geological time. When discussed herein and for the sake of clarity, the horizons are implicitly assumed to be sorted according to their pseudo geological time so that H(t(1)) is assumed to correspond to the older sediments and H(t(N)) to the younger. In other words, the deposition time t(i) of H(t(i)) is lower than the deposition time t(i+1) of H(t(i+1)).

Stratigraphic Cells and Fibers

Reference is made to FIG. 1, which is a schematic illustration of a conventional stratigraphic cell. A stratigraphic cell 110 (e.g., also referred to as a cell), may be a hexahedral part of a subsurface model or geological space 100 having for example the following characteristics. Each cell 110 may have a bottom face 120 and a top face 130, respectively coincident with successive reference horizons H(t(i−1)) 150 and H(t(i)). Top face 130 and bottom face 120 of each cell 110 may have a substantially rectangular shape having angles that approximate right angles. If an edge of a cell crosses a fault, then one of the faces of cell 110 may approximate the geometry of the fault, for example, in a stair-stepped way. In a direction approximately orthogonal to the horizons, vertices of cells 110 may be aligned along smooth curves also called primal fibers 170, which may also be referred to as "fibers" or "pillar's". Cells 110 may include lateral faces 140, which may be faces approximately orthogonal to reference horizons H(t (i−1)) 150 and H(t(i)). Lateral faces 140 may have approximately rectangular shapes which may be degenerated. For example, each edge of lateral face 140 collinear with fiber 170 may for example be degenerated into a single point.

Stratigraphic Grid

A stratigraphic grid (e.g., also referred to as a "SGrid") may include a plurality of stratigraphic cells. A stratigraphic grid may be arranged in a substantially regular pattern such that for example all the cells constitute a partition of the studied geological domain without any gap or overlapping and such that, from a topological point of view, cells may share only substantially common vertices, substantially common edges, and substantially common faces.

Reference is made to FIGS. 2 and 3, which are schematic illustrations of structured and unstructured stratigraphic grids, respectively. A structured stratigraphic grid may be a stratigraphic grid 200 where substantially all of cells 210 have substantially the same topological structure, for example, when all of cells 210 have a substantially hexahedral shape Otherwise, a stratigraphic grid 300 may unstructured and may have irregular cells 310, such as polyhedral cells that are not hexahedral.

Local Grid Refinement

One or more cells of a SGrid may be split or further partitioned into subcells. For example such a refinement of the cells (e.g., referred to a "local grid refinement") may be used, locally, to approximate more closely the geometry of a fault or a neighborhood of a well. Typically, the refinement of a "mother" hexahedral cell into smaller cells may be obtained by partitioning the mother hexahedral cell by planes parallel to its facets. Other refinement methods based on Delaunay tessellation may be used.

Non-Neighborhood Connectivity

Reference is made to FIG. 4, which is a schematic illustration of a pail of adjacent cells. A SGrids may be constructed in such a way that pairs of adjacent cells not sharing vertices, for example, cell 410, C1, and cell 412, C2, may be generated. Adjacent cells 410 and 412 (C1, C2) may be located on both sides of a fault in such a way that a facet 440, F1, of cell 410, C1, shares, approximately, a common part 450, F12, with a facet 442, F2, of cell 412, C2. Common area 450, F12, may be the intersection area of facet 440, F1, and facet 442, F2. When common part 450, F12, is not substantially identical for facet 440, F1, or facet 442, F2, then facets 440, F1, and 442, F2 may be said to touch each other in a "non-neighborhood" connectivity style the cells 410 and 412 (C1, C2) may be said to have a "non-neighborhood" connectivity.

Primal-Cookie-Cutter Algorithm

A partitioning algorithm (e.g., referred to as a "primal cookie cutter" algorithm) may be used to generate SGrids. A geological space may be partitioned by the primal cookie cutter algorithm for representing data. The partitioning algorithm may include using a plane P which may be approximately parallel to a reference horizon, for example, a horizontal plane. The plane P approximately parallel to a reference horizon may be covered by a mesh including two families of straight lines, family X and family Y. Family X and family Y may be for example defined as follows. Each straight line "x(i)" belonging to family X may be substantially parallel to the other straight lines of family X. Each straight line "y(j)" belonging to family Y may be substantially parallel to the other straight lines of family Y. Each straight line of the family X may be substantially orthogonal to substantially all of the straight lines of family Y, and conversely, each straight line of the family Y may be substantially orthogonal to substantially all of the straight lines of family X. One may imagine that each straight line of families X and Y may be for example made of a stiff iron wire which may have the capability to cut a subsurface when moved through the subsurface of a geological studied domain. The geological studied domain may be already cut by reference horizons and faults associated with the subsurface. If the plane P is moved in a substantially constant direction through the subsurface, for example, a vertical direction, then the subsurface may be partitioned into a family of cells. If there ale no faults and the horizons are approximately horizontal, then the set of cells obtained may be a SGrid. However, in the presence of faults, the cells so generated may be cut by faults and may no longer be hexahedral cells and become polyhedral cells with other than six sides.

Reference is made to FIGS. 5-8, schematic illustrations of modelled subsurface structures partitioned using primal cookie cutter algorithms. FIGS. 5-8 show that such algorithms may generate polyhedral cells other than hexahedral cells in neighbourhoods of faults.

Corresponding to circled parts 540 of FIG. 5, a large number of polyhedral cells 550 different from hexahedra, may be generated from a subsurface 500.

Corresponding to circled parts 640 of FIG. 6, a large number of polyhedral cells different from hexahedra, may be generated from a subsurface 600.

Some primal cookie cutter algorithms include a limitation that all the reference horizons are approximated continuously across faults, so that faults are not substantially modelled correctly. Circled part 740 of FIG. 7 shows the consequences of such a limitation, for example, that the partitioning algorithm may generate systematically degenerated cells along the faults. A further consequence of such a limitation may be that the algorithm does not sufficiently work in presence of reverse faults or pairs of faults intersecting each others in a "Y" or "X" way.

FIG. 8 shows a stratigraphic grid generated using a primal cookie cutter algorithm which may work only in a specific and, for example, unrealistic, case. Such a case may require a subsurface 800 to be partitioned into large hexahedral "master" blocks bounded laterally by four faults and vertically by a top horizon and a bottom horizon. These large hexahedral master blocks may be further partitioned into smaller cells, for example, using a family of surfaces approximately parallel to the four lateral faults and a family of surfaces approximately parallel to the top and bottom horizons. As shown in FIG. 8, to fit the shape of the faults, the large master blocks, and consequently the cells, may be substantially distorted. Moreover, "dying faults", which may only partially cut subsurface 800 of the geological domain of interest, typically cannot be substantially modelled correctly.

Furthermore, a primal cookie cutter algorithm may not work in presence of pails of faults intersecting each other in an "Y" or "X" way.

FIG. 2 shows the most common type of a stratigraphic grid 200 currently used to decompose a subsurface into hexahedral cells 210. Stratigraphic grid 200 may be obtained using a primal cookie cutter algorithm using a field of fibers parallel to faults of the modelled subsurface. As an immediate consequence of using such fibers, typically substantially stratigraphic grids cannot be built in the presence of pails of faults intersecting each others in a "Y" or "X" way. Other solutions may be required to avoid generating distorted cells. The front vertical part of FIG. 2 shows that, independently of these construction difficulties, when faults are not substantially vertical, cells 210 aligned vertically along a same fiber may have substantial distortions or variations in sizes and angles.

In each of the examples shown in FIGS. 5-8, of stratigraphic grids generated using primal cookie cutter algorithms, the drawback of generating massively degenerated cells, or polyhedral cells departing strongly from an hexahedral shape having faces cutting each others at approximately right angles, is typically unavoidable. However, it is preferable to avoid generating such polyhedral for example, for the following reasons. For each pair of adjacent cells (e.g., cells 410 and 412 (C1, C2), described above in reference to FIG. 4), flow simulators typically solve a balance equation stating the conservation of the mass of fluids moving through their common face (e.g., common part 450, F12, described above in reference to FIG. 4). Thus, the more faces cells have, the more equations flow simulators may be required to solve and the more computer computation time and memory may be needed. Another reason to avoid generating degenerated cells may be that, in order to ensure numerical stability, flow simulators may require that the common face shared by two adjacent cells are substantially orthogonal to the segment joining the two centers of these cells. Such a constraint may typically be honored when adjacent cells are sufficiently aligned in a regular pattern. For example, if all the cells have hexahedral shapes with faces approximately orthogonal, then such a constraint may be automatically honoured. Yet another reason to avoid generating degenerated cells may be that substantially most of current commercial flow simulators substantially only accept hexahedral cells. It may be appreciated that substantially all the methods using a primal cookie cutter algorithm presented above are unable to honor these constraints.

SUMMARY OF THE INVENTION

Embodiments of the invention provide a system and method for partitioning data for modelling a geological structure including laterally partitioning the data into multiple columns, where each column may be substantially laterally centered about a dual fiber and vertically partitioning each column at each of multiple intersection points of multiple surfaces and the dual fiber about which the column may be substantially laterally centered.

BRIEF DESCRIPTION OF THE DRAWINGS

The principles and operation of the system, apparatus, and method according to embodiments of the present invention may be better understood with reference to the drawings, and the following description, it being understood that these drawings are given for illustrative purposes only and are not meant to be limiting.

Figure 1:
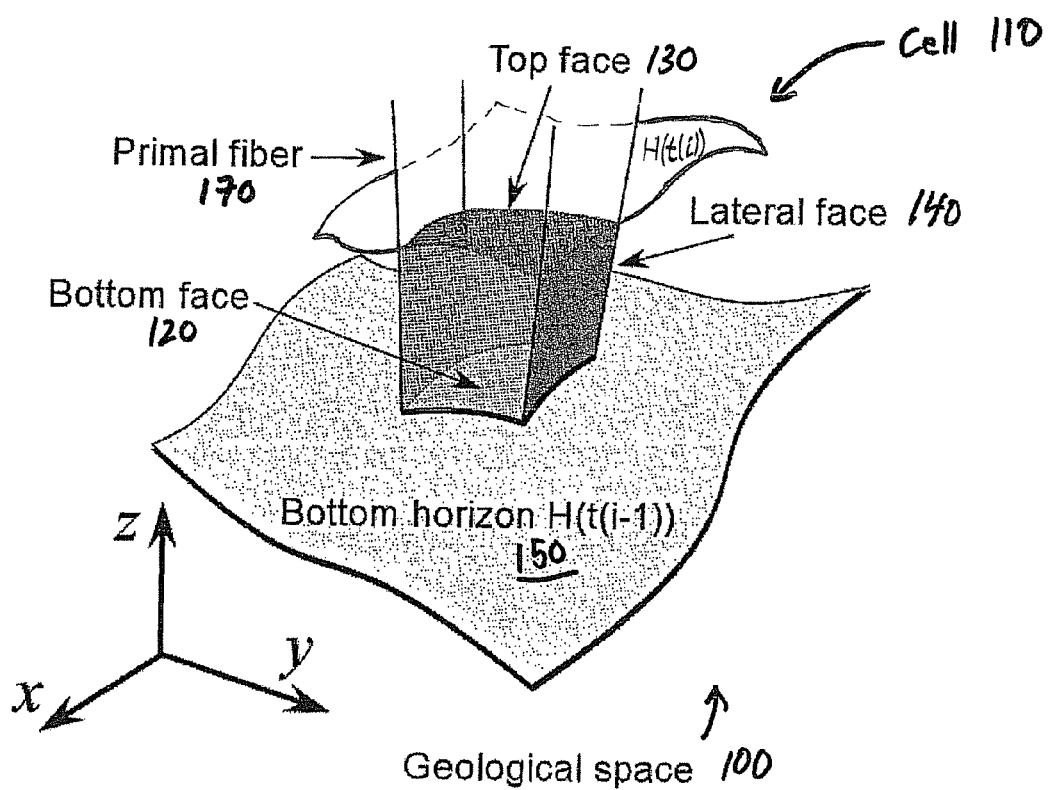
FIG. 1 is a schematic illustration of a conventional stratigraphic cell.
Figure 2:
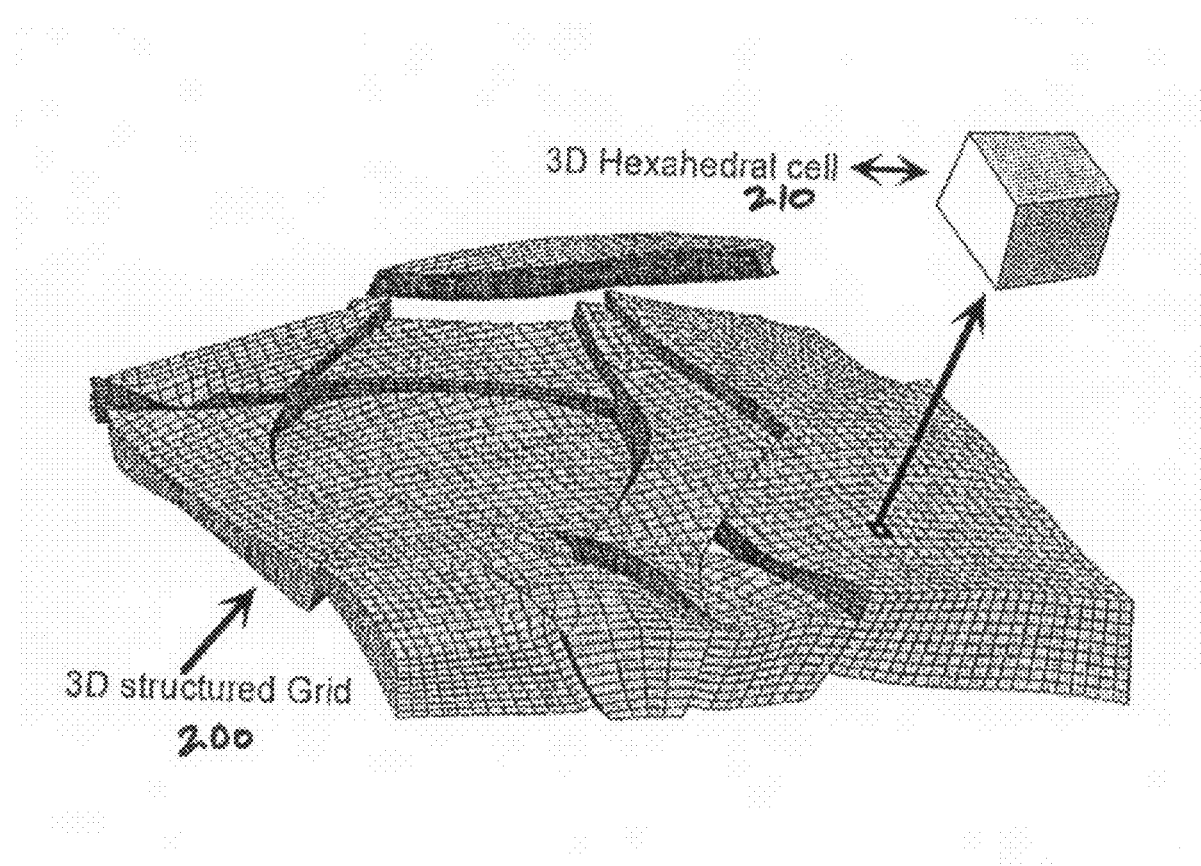
FIGS. 2 and 3 are schematic illustrations of structured and unstructured stratigraphic grids, respectively.
Figure 3:
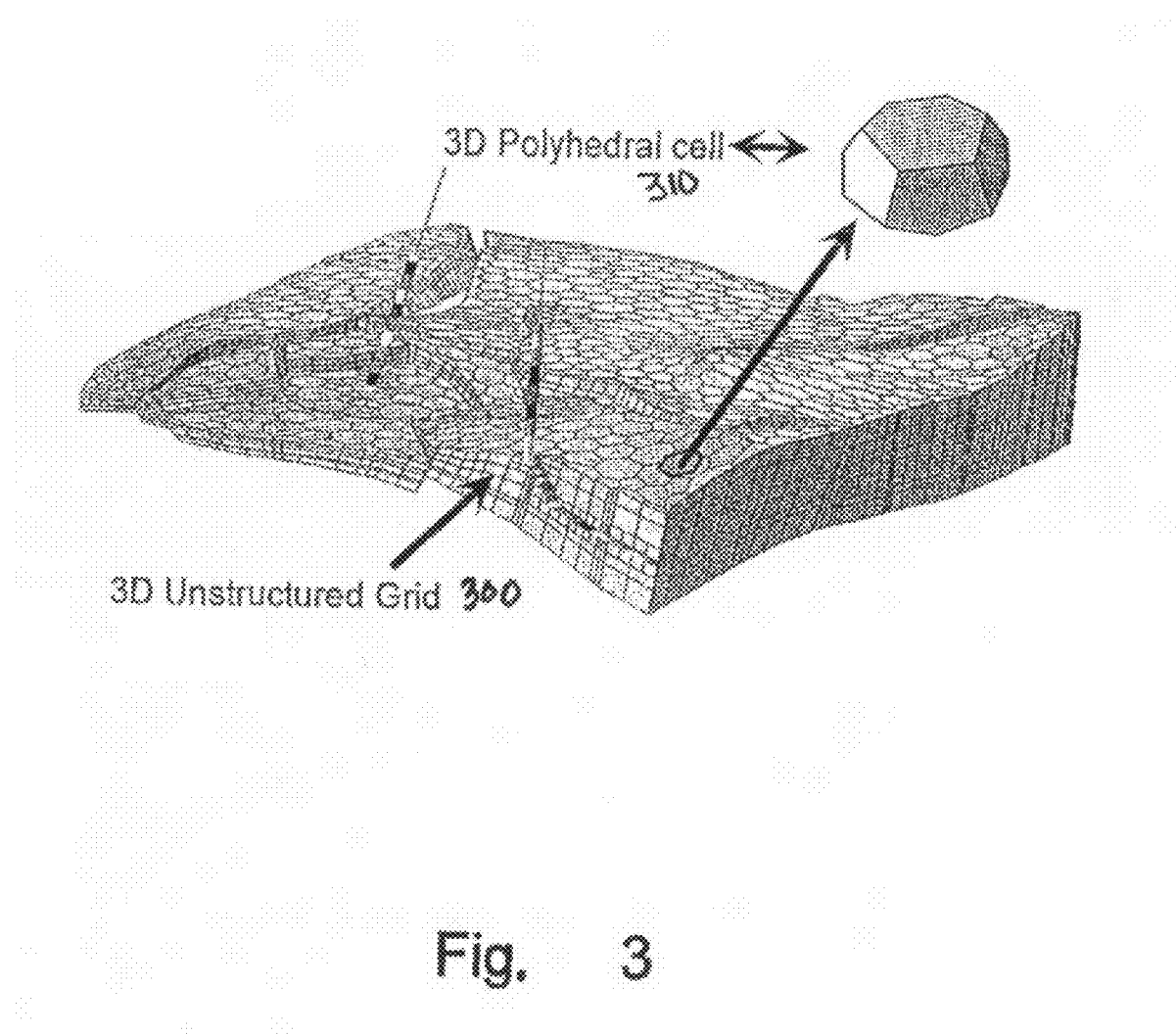
Figure 4:
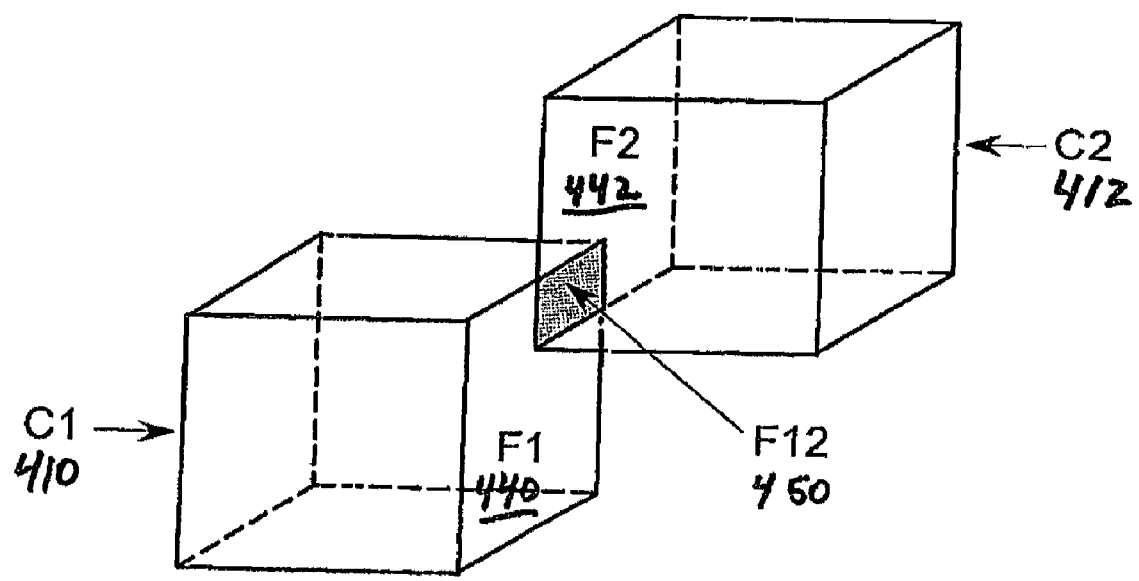
FIG. 4 is a schematic illustration of a schematic illustration of a pair of adjacent cells.
Figure 5:
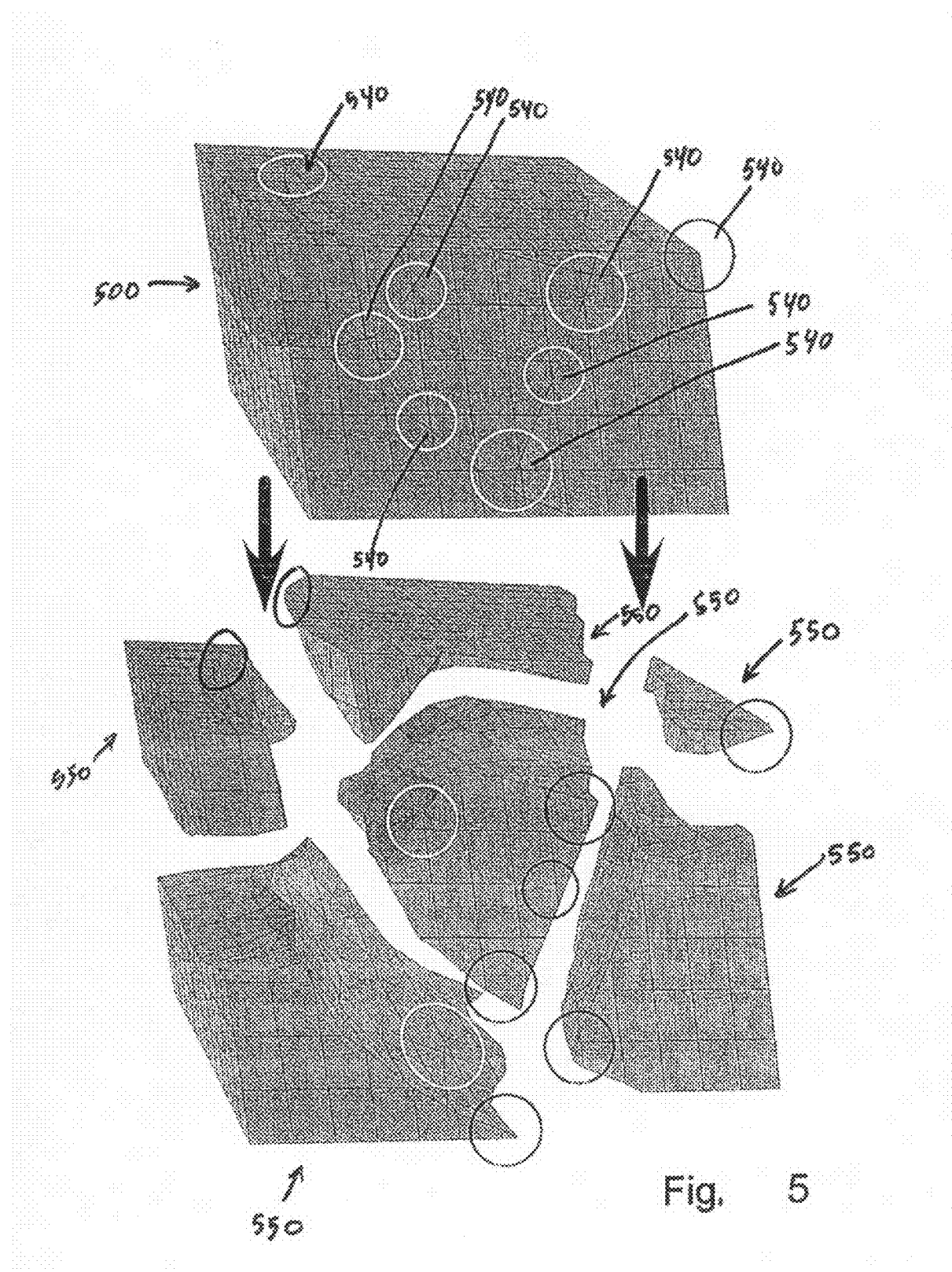
FIGS. 5-8 are schematic illustrations of modelled subsurface structures partitioned using primal cookie cutter algorithms.
Figure 6:
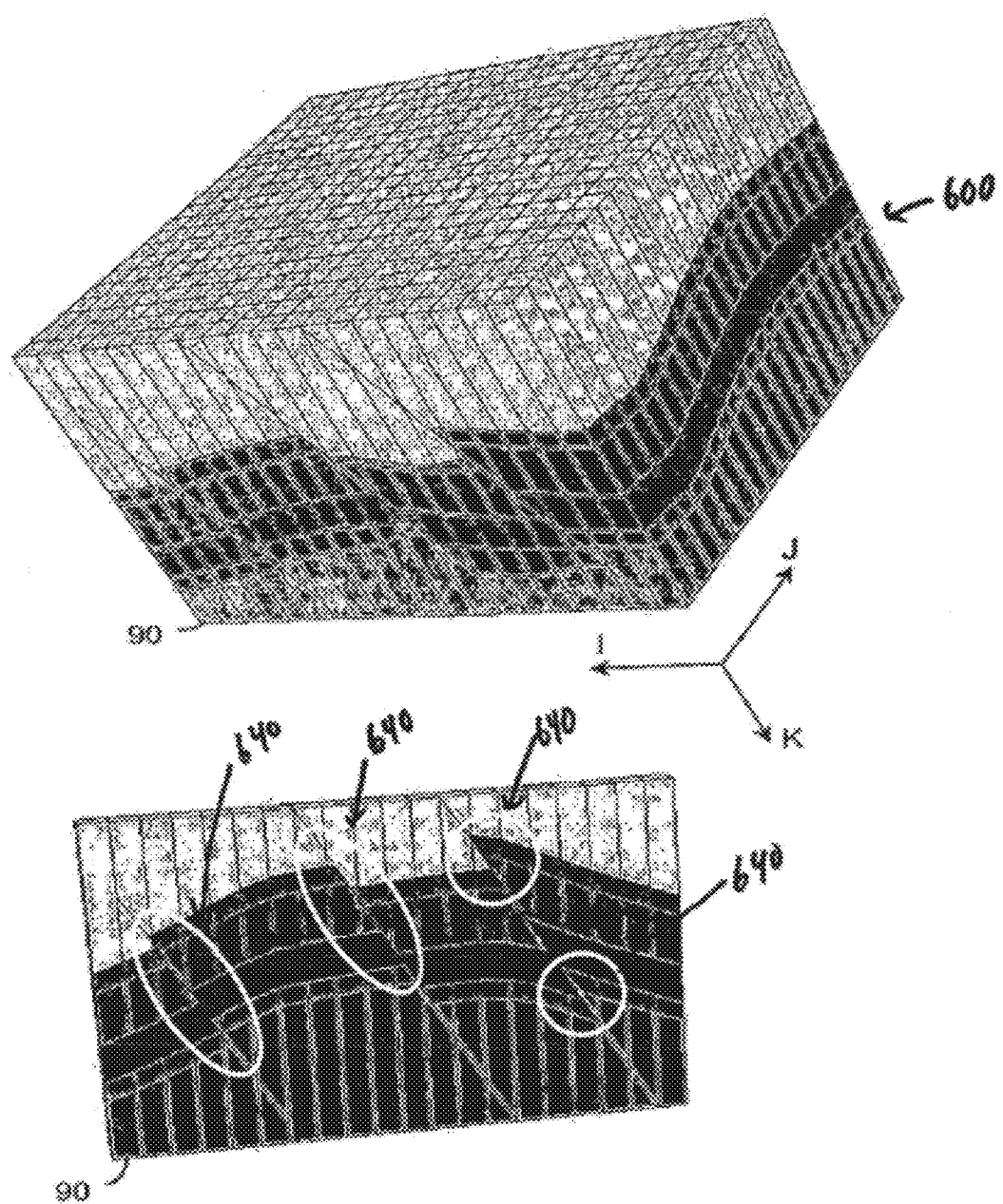
Figure 7:
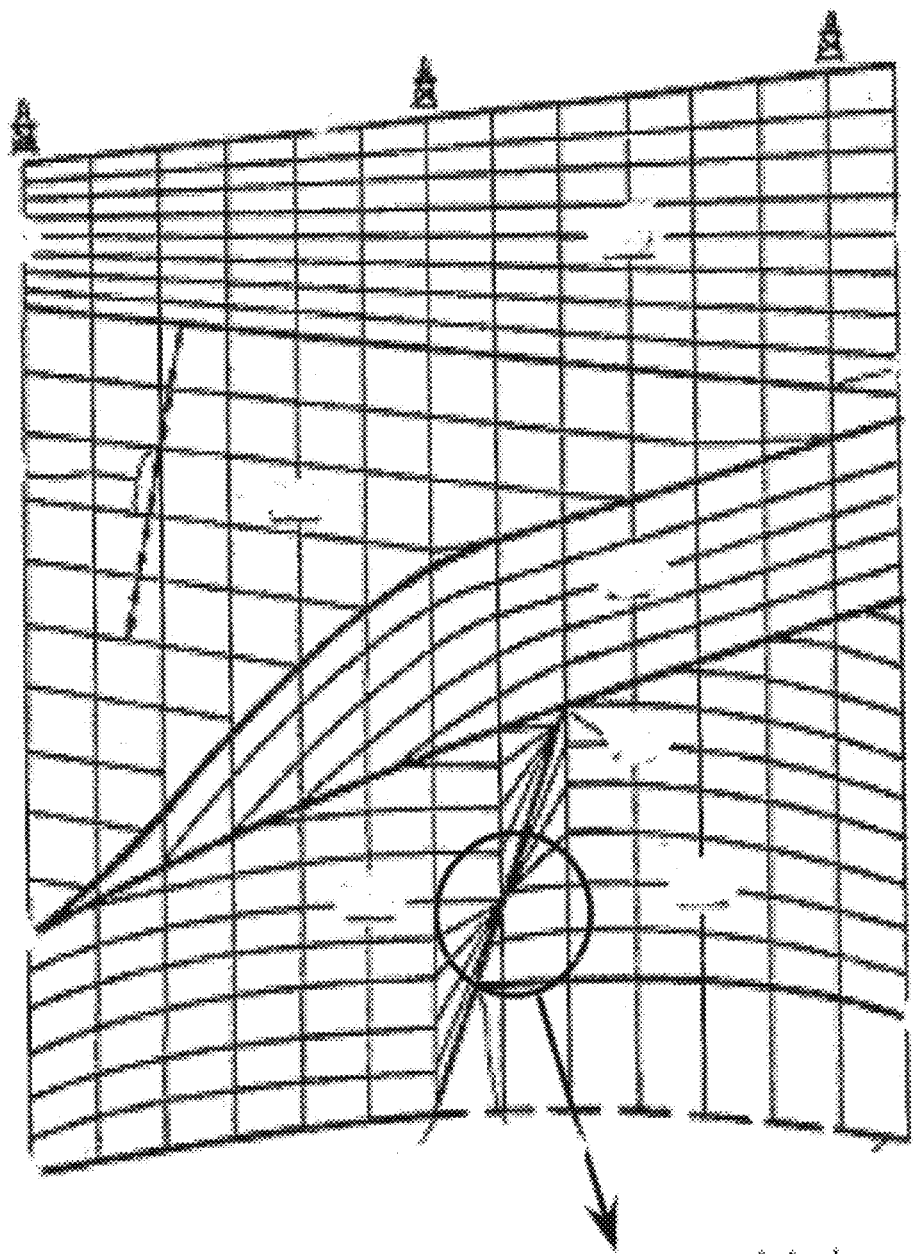
Figure 8:
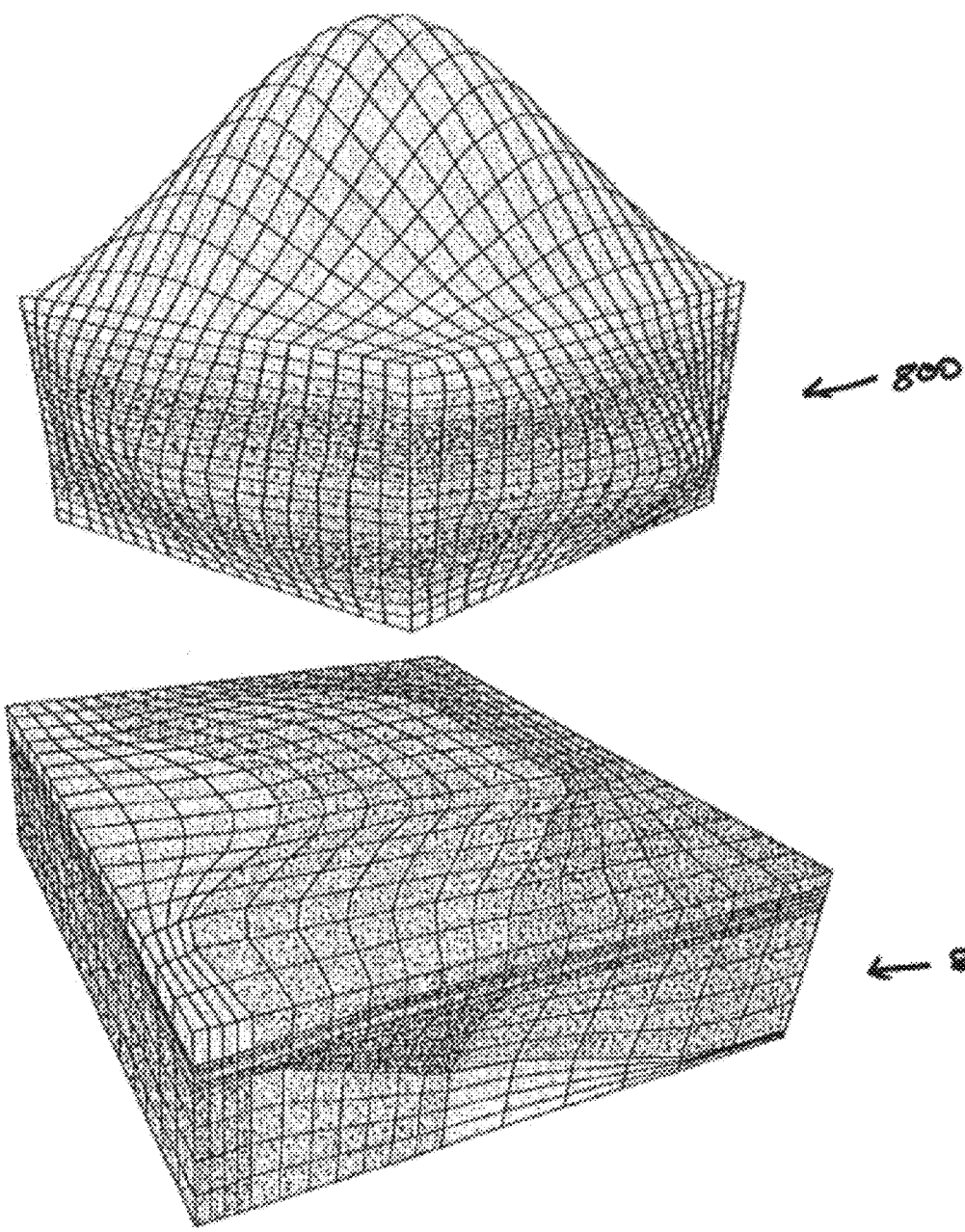

For simplicity and clarity of illustration, elements shown in the drawings have not necessarily been drawn to scale. For example, the dimensions of some of the elements may be exaggerated relative to other elements for clarity. Further, where considered appropriate, reference numerals may be repeated among the drawings to indicate corresponding or analogous elements throughout the serial views.

DETAILED DESCRIPTION OF THE INVENTION

In the following description, various embodiments of the invention will be described. For purposes of explanation, specific examples are set forth in order to provide a thorough understanding of at least one embodiment of the invention. However, it will also be apparent to one skilled in the art that other embodiments of the invention are not limited to the examples described herein. Furthermore, well known features may be omitted or simplified in order not to obscure embodiments of the invention described herein.

In the frame of this invention, a bland new method is proposed called "Dual-Cookie-Cutter", which may include a partitioning algorithm for generating SGrids (e.g., referred to as a "dual cookie cutter" algorithm). The dual cookie cutter algorithm may not have the drawbacks associated with the primal cookie cutter algorithm, for example, as discussed above. Moreover, in contrast with the primal cookie cutter algorithm, the dual cookie cutter algorithm may generate substantially stratigraphics cells, regardless of the complexity of the horizons and/or faults. In particular, dual cookie cutter algorithm generate substantially stratigraphics cells in presence of pairs of faults intersecting each other in a "Y" or "X" way and in presence of reverse faults.

Figure 9:
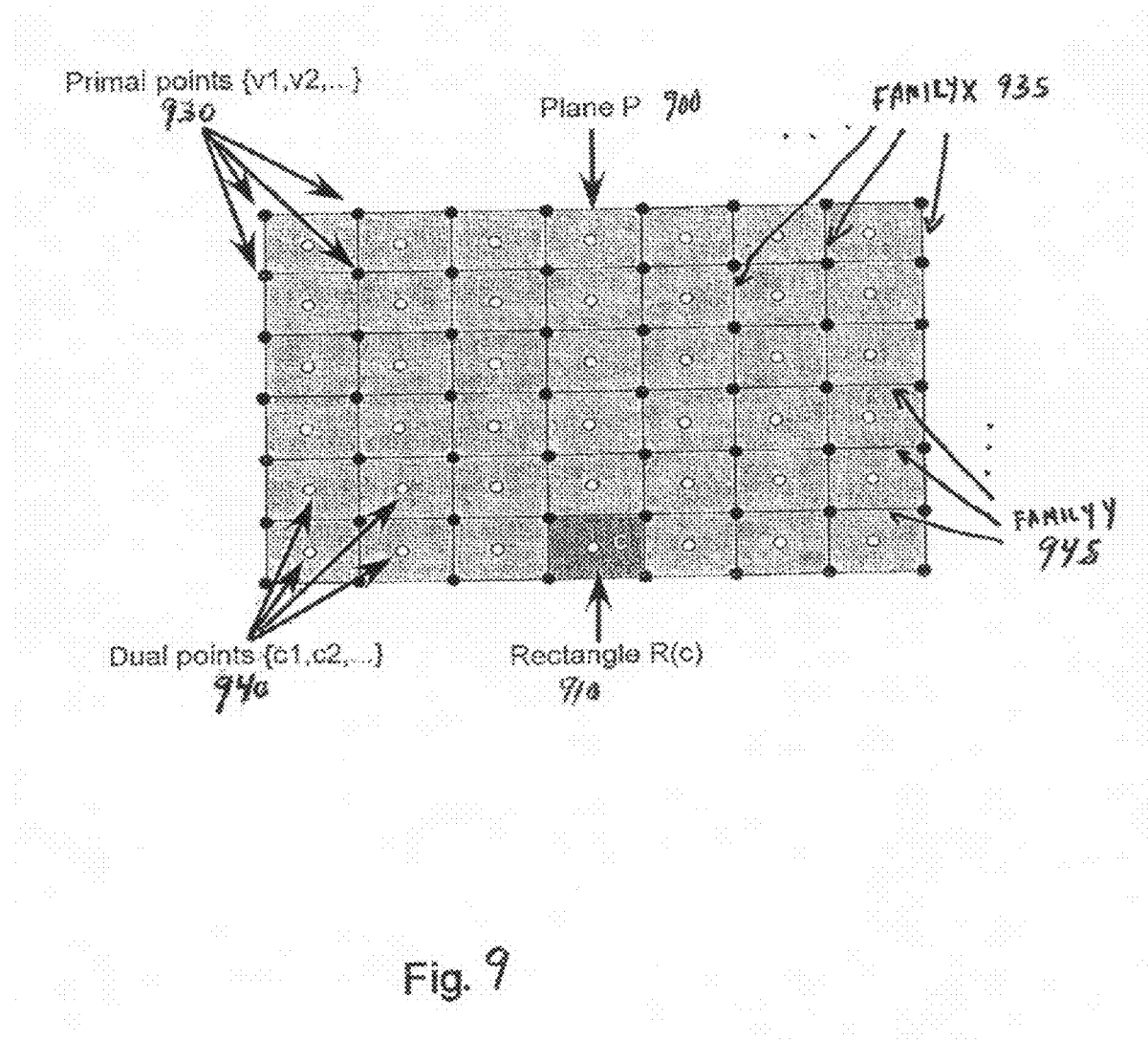
FIG. 9 is a schematic illustration of a two dimensional partition of a plane approximately parallel to the horizons used by the dual cookie cutter algorithm for representing data according to an embodiment of the invention.

Reference is made to FIG. 9, which is a schematic illustration of a two dimensional partition of a plane approximately parallel to the horizons used by the dual cookie cutter algorithm for representing data according to an embodiment of the invention. The partitioning algorithm may include using a plane 900, P, which may be a continuous surface approximately parallel to a reference horizon, for example, a horizontal plane. Plane 900, P, may be coveted by a mesh including of two families of straight lines, family X 935 and family Y 945. Family X 935 and family Y 945 may be for example defined as follows. Each straight line "x(i)" belonging to family X 935 may be substantially parallel to the other straight lines of family X 935. Each straight line "y(j)" belonging to family Y 945 may be substantially parallel to the other straight lines of family Y 945. Each straight line of the family X 935 may be substantially orthogonal to substantially all of the straight lines of family Y 935, and conversely, each straight line of the family Y 935 may be substantially orthogonal to substantially all of the straight lines of family X 935.

Two sets of points may for example be defined as follows on plane 900, P. A first set of points, $V=\{v1, v2, \ldots\}$, may correspond to the intersections of family X 935 and family Y 945 of straight lines. The points of the set, V, may be for example refereed to as "primal points" 930. A second set, $C=\{c1, c2, \ldots\}$, may correspond to the centers of rectangular 2D cells bounded on plane 900, P, by family X 935 and family Y 945 of straight lines. The points of the set, C, may be for example referred to as "dual points" 940. Each dual point 940, c, of the set, C, may correspond to a center of a rectangle 910, R(c), of plane 900, P, which may be for example, bounded by edges parallel to the straight lines of family X 935 and family Y 945.

Figure 10:
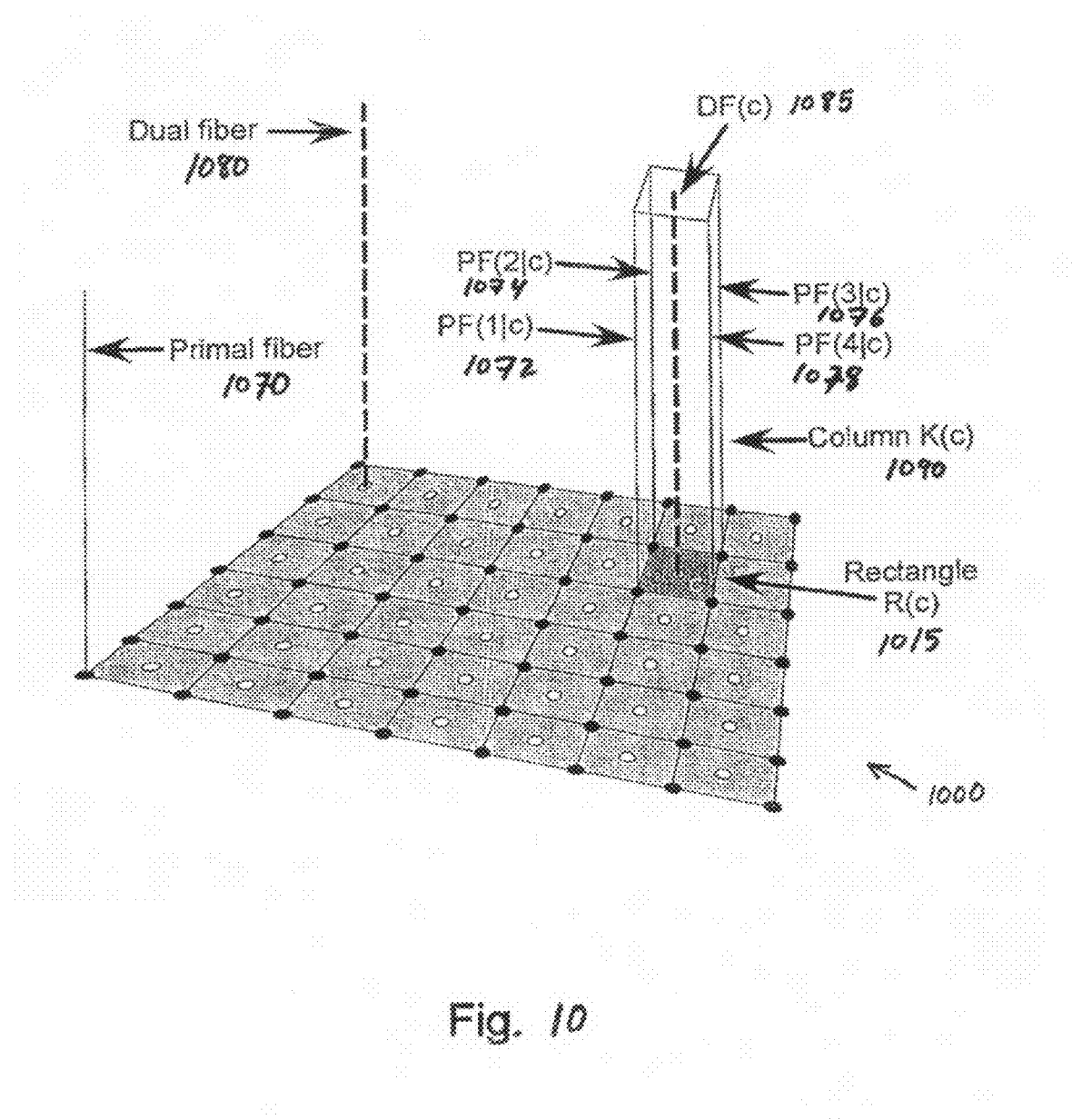
FIG. 10 is a schematic illustration of a three dimensional partition of a geological domain used by the dual cookie cutter algorithm for representing data according to an embodiment of the invention.

Reference is made to FIG. 10, which is a schematic illustration of a three dimensional partition of a geological domain used by the dual cookie cutter algorithm for representing data according to an embodiment of the invention. The partitioning algorithm may include using a plane 1000, P, which may be partitioned according to embodiments of plane 900, P, described above in reference to FIG. 9. It may be assumed that plane 1000, P, is approximately parallel to horizons of the geological domain of interest. A field of straight lines, for example, parallel to a common direction approximately orthogonal to the horizons, may be launched from the points of sets V and C. For example, if the horizons of the geological domain are approximately horizontal, F then plane 1000, P, may be chosen to be horizontal and substantially all of the parallel straight lines launched from the sets of points V and C may be vertical. Two families of such straight lines or fibers may be generated. One family of fibers, which may be referred to as "primal fibers" 1070, may include the straight lines launched from the set V of the primal points. Another family of fibers, which may be referred to as "dual fibers" 1080, may include the straight lines launched from the set C of the dual points.

Each dual fiber 1085, DF(c), associated with a dual point, c, of the set, C, may be surrounded by four closest primal fibers 1072, 1074, 1076, and 1078, also denoted {PF(1|c), PF(2|c), PF(3|c), and PF(4|c)}. Each dual fiber 1085, DF(c), associated with a dual point, c, of the set, C, may also be associated with a column 1090, K(c), corresponding to a part of the 3D geological space swept by a rectangle 1015, R(c), when rectangle 1015, R(c), oriented parallel to plane 1000, P, may be moved along dual fiber 1085, DF(c). Each columns 1090, K(c), may be laterally centered about dual fiber 1085 DF(c) and the vertical edges of column 1090, K(c), may correspond to primal fibers 1070, {PF(1|c), PF(2|c), PF(3|c), PF(4|c),}.

Figure 11:
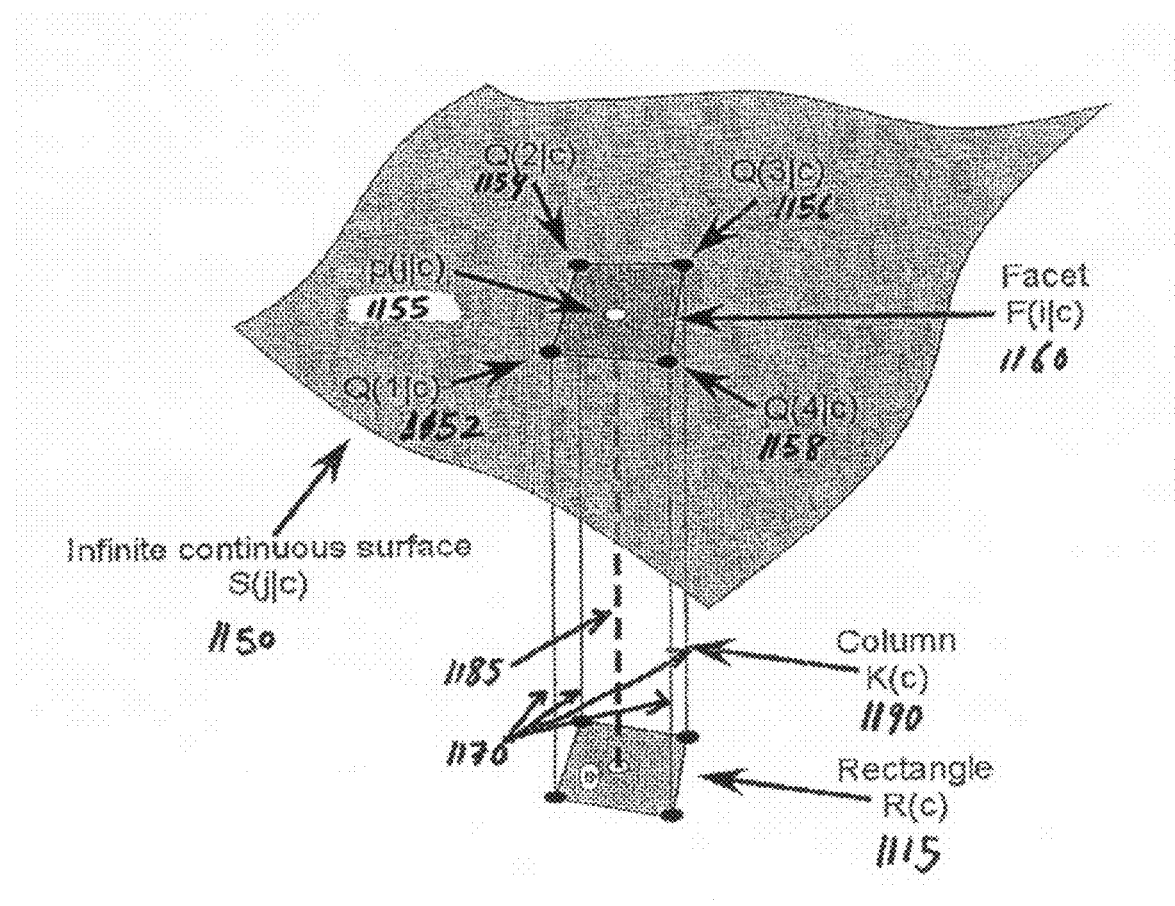
FIG. 11 is a schematic illustration of an infinite continuous surface coincident with geological irregularities and centered about a dual fiber used to partition a geological domain using a dual cookie cutter algorithm according to an embodiment of the invention.

Reference is made to FIG. 11, which is a schematic illustration of an infinite continuous surface coincident with geological irregularities and centered about a dual fiber used to partition a geological domain using a dual cookie cutter algorithm according to an embodiment of the invention. In order to partition the geological domain using the dual cookie cutter algorithm, the following definitions are provided for the sake of clarity. Other definitions may be used.

A set of surfaces, HF, may be defined to include all the reference horizons and faults (e.g., and unconformities) of the geological space. According to embodiments of the invention, unconformities may be treated as faults and faults may be understood as either real faults or unconformities. A series of intersection points 1155 {p(1|c), p(2|c), . . . } and an associated series of infinite continuous surfaces 1150 {S(1|c), S(2|c), . . . , S(M|c)} may be defined for example, as follows. Intersection points 1155 {p(1|c), p(2|c), . . . } may be the intersection points of each of the surfaces of the set, HF, with each of the dual fibers, 1085, DF(c). Intersection points 1155 {p(1|c), p(2|c), . . . } may be sorted so that p(j,c) is below p(j+1|c). Infinite continuous surfaces 1150 S(j|c) may be infinite continuous surfaces which, for example, locally around p(j|c), approximate a surface HF(j|c), which may be the intersection of the surface HF with dual fibers, 1185, DF(c) at intersection point 1155 p(j|c). In one embodiment, for example, infinite continuous surfaces 1150 S(j|c) may be a plane tangential to HF(j|c) at intersection point 1155 p(j|c). In other embodiments, infinite continuous surfaces 1150 may include any continuous approximation such as, for example, a polynomial approximation.

Embodiments according to the present invention of partitioning algorithms used for building a stratigraphic grid using the dual cookie cutter algorithm may include two main successive steps, which may for example, be referred to as a "cutting step" and a "gluing step". These steps may for example proceed as described below. Other or additional steps may be included; and some embodiments may include different sets of steps.

Dual-Cookie-Cutter Algorithm: The Cutting Step

The cutting step may include partitioning each column 1090, K(c), into a series of hexahedral cells, each having bottom and top faces that may correspond, for example, rigorously or approximately, to an intersection of the infinite continuous surfaces 1150 {S(1|c), S(2|c), . . . , S(M|c)}, with column 1190, K(c).

In one embodiment, for each dual point c, the cutting step may include splitting column 1090, K(c), for example, as follows:
1. four empty stacks of points may be created, which may for example, be denoted, {QF(1|c), QF(2|c), QF(3|c), QF(4|c)}. each of the stacks being associated with one of four vertical edges of the column K(c);
2. for i=1 to 4, intersection points 1152, 1154, 1156, and 1158, Q(i|c), of the first infinite continuous surfaces 1150 S(1|c) with each of primal fibers 1170 PF(i|c) may be computed and the intersection points Q(i|c) may be stored on top of the respective stack QF(i|c);
3. a first rectangular bottom facet 1160 F(1|c) may be generated, for example, having intersection points 1152, 1154, 1156, and 1158, {Q(1|c), Q(2|c), Q(3|c), Q(4|c)}, as vertices;
4. for j=2 to M, the following steps may be executed:
    a. for i=1 to 4:
        i. the intersections points Q(i|c) of infinite continuous surfaces S(j|c) with primal fibers PF(i|c) may be computed;
        ii. if the intersections point Q(i|c) is higher than the point already stored on top the stack QF(i|c), then the intersections point Q(i|c) may be stored on top of the stack QF(i|c);
        iii. otherwise:
            1. a copy Q*(i|c) of the top point of QF(i|c) may be generated;
            2. move position of Q*(i|c) slightly upwards along the primal fiber PF(i|c);
            3. the copy Q*(i|c) may be stored on the top of the stack QF(i|c).
    b. a rectangular facet F(j|c) may be generated having the points stored on top of the stacks {QF(1|c), QF(2|c), QF(3|c), QF(4|c)} as vertices;
    c. a hexahedral cell K(j−1|c) may be generated by linking the bottom rectangular facet F(j−1|c) with the top rectangular facet F(j|c) in such a way that the new edges so generated are aligned with the primal fibers 1170, {PF(1|c), PF(2|c), PF(3|c), PF(4|c)};
    d. if p(j|c) corresponds to an intersection of the dual fiber 1185, DF(c), with a fault or surface of HF, then to improve the shape of the cell K(j−1|c), the vertices of the cell K(j−1c) may be moved to be coincident with a plane approximately parallel to the neighboring horizons, such that for example, the facet F(j|c) does not intersect the facet F(j−1c).

This series of cutting steps may be repeated for each dual point c, in the set, C, in order to partition each corresponding column 1190, K(c), as described. Accordingly, an embodiment of the dual cookie cutter algorithm may partition each of columns 1190, K(c), into a series of adjacent cells {K(2|c), K(3|c), . . . , K(M|c)} in such a way that each pair of cells K(j−1|c) and K(j|c) may share a common rectangular facet F(j,c) having vertices located on primal fibers 1170, {PF(1|c), PF(2|c), PF(3|c), PF(4|c)}. It may be observed that a stair stepped approximation of faults generated by the dual cookie cutter algorithm, for example, both in the horizontal and vertical directions, may generate cells having approximately orthogonal faces.

According to this partitioning mechanism, the vertices of cells belonging to two neighboring columns K(c1) and K(c2) may be disjoint, even when there ale no faults therebetween. In order to restore the lateral connectivity between adjacent cells of two neighboring columns, a "gluing" step may be executed. Other or different operations may be used.

Dual-Cookie-Cutter Algorithm: The Gluing Step

Four "sibling" stacks {QF(j1|c1(v)), QF(j2|c2(v)), QF(j3|c3(v)), QF(j4|c4(v))}, for example, containing points generated by the dual cookie cutter algorithm may correspond to each primal point, v, of the set, V. Four column 1190, K(c), of cells incident (e.g., touching) may correspond to each primal fiber and the associated primal point, v, of the set, V. It may be noted that, on the border of the studied domain, some sibling stacks may be empty. An embodiment of the gluing step may substantially merge all points stored in corresponding sibling stacks when for example the following conditions are honored. The conditions may require that the points are collocated or approximately collocated on the same primal fiber 1170 associated with a primal point v, and that the points belong to the same surface (horizon or fault). The gluing step may merge each pair of lateral faces, for example, which may be collocated or geometrically coincident (e.g., or approximately coincident), into one unique face shared by two cells neighboring cells. The lateral faces which may remain not glued may correspond to faces or cells having "non-neighborhood connectivities".

In one embodiment, to obtain such a gluing, each sibling stack may be, for example, scanned in parallel, from top to bottom, and this process may be repeated iteratively for all sibling stacks for example according to the following dual cookie cutter algorithm gluing step. F or example:

For each primal fibers 1170 PF(i|c):
1. four, associated sibling stacks may be selected;
2. all the points on top of their respective sibling stacks may be copied into a list of points Q={Q1,Q2,Q3,Q4} and these points may be removed from their respective stacks;
3. any subset of Q including points approximately located at similar positions on the same surface, horizon or fault, belonging to the set HF, may be merged into a single point; and
4. if the sibling stacks are not empty, return to step (1) above.

After repeating the dual cookie cutter algorithm gluing step for all the primal fibers 1170 PF(i|c), adjacent lateral faces sharing glued points as vertices may be fully, partly or not glued. For example, if the four vertices of two adjacent lateral facets are merged, then these two facets may be implicitly and automatically merged into one facet. For example, if some, but not all, of the vertices of two adjacent lateral facets are not merged, then there may be "non-neighborhood connectivities" between these facets. Typically, the dual cookie cutter algorithm gluing step does not generate non-neighborhood connectivities through top or bottom facets; other embodiments may operate otherwise.

In embodiments where an intersection point 1155 p(j|c) may be substantially close to a fault, infinite continuous surface 1150 S(j|c) may approximate continuously substantially only the part of the surface HF(j|c) located on the same side of the fault as the intersection point 1155 p(j|c). Accordingly, a substantially accurate stair step approximation of the faults may be automatically ensured.

Figure 12:
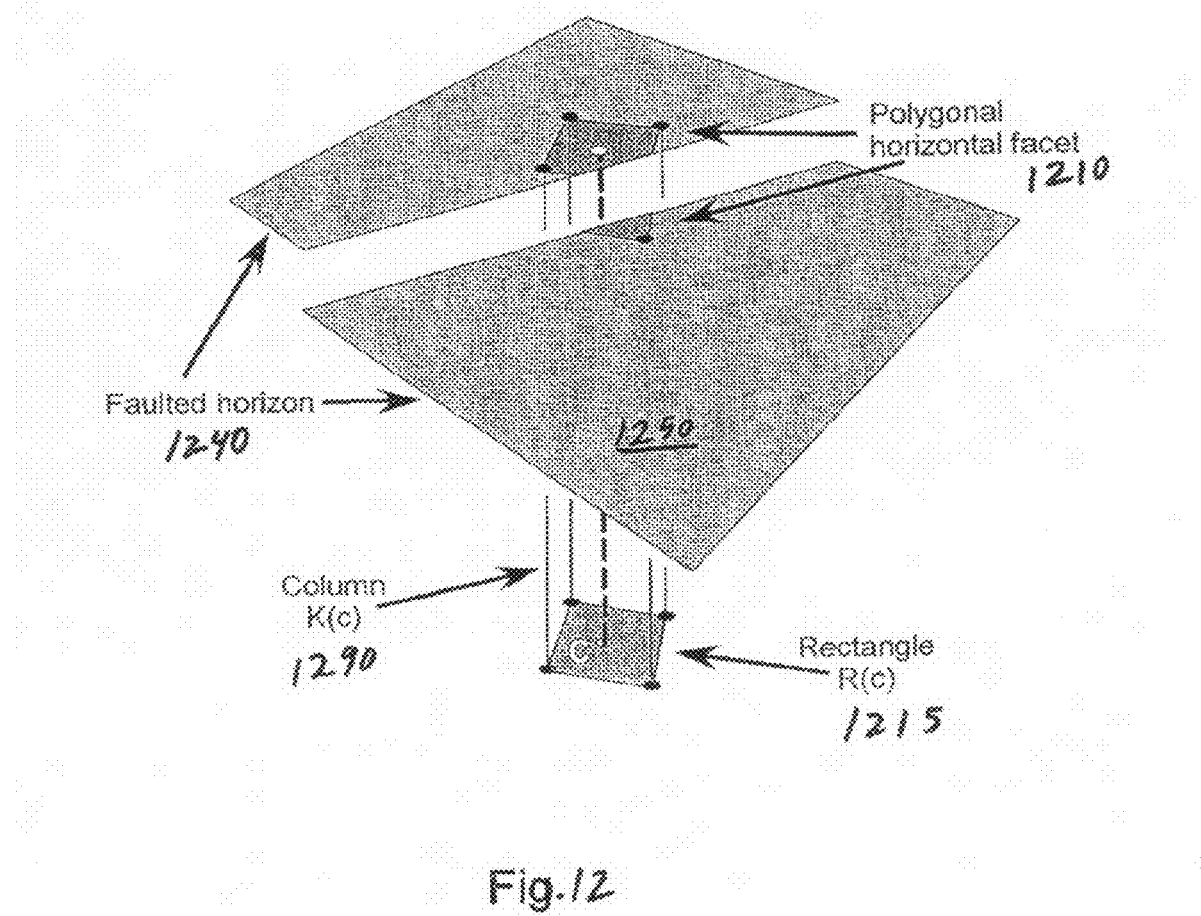
FIGS. 12 and 13 are schematic illustrations of partitions of geological domains for representing data, using a primal cookie cutter algorithm according to a conventional method and a dual cookie cutter algorithm according to an embodiment of the invention, respectively.
Figure 13:
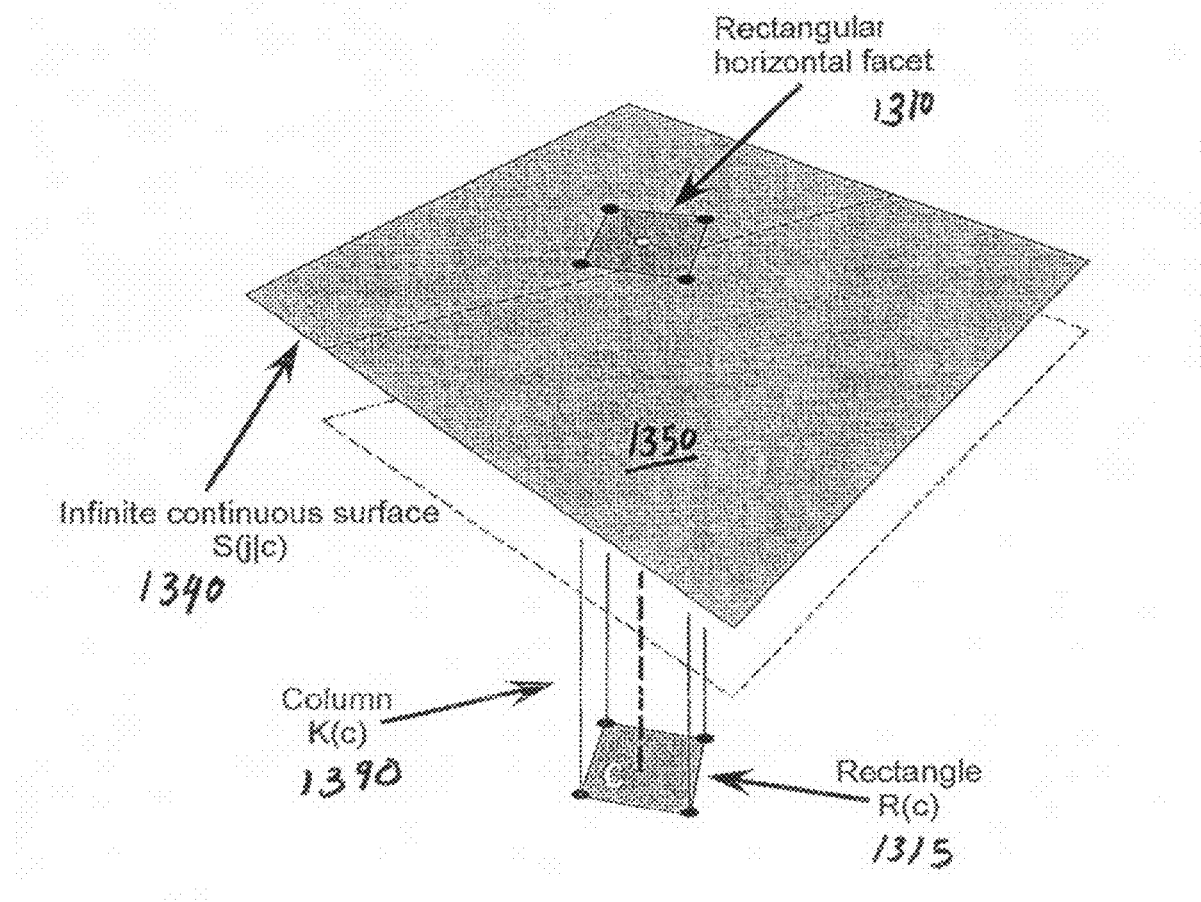

Reference is made to FIGS. 12 and 13, which are schematic illustrations of partitions of geological domains for representing data, using a primal cookie cutter algorithm according to a conventional method and a dual cookie cutter algorithm according to an embodiment of the invention, respectively. As illustrated in these figures, there may be a significant difference between the way the primal cookie cutter algorithm and the dual cookie cutter algorithm generate horizontal facets F(j|c), 1210 and 1310, associated with a reference horizon H(t(j)), 1250 and 1350, cutting a column K(c), 1290 and 1390, respectively, in a neighborhood of a fault. For example, using the dual cookie cutter algorithm, the intersection of column K(c), 1390, with an infinite continuous surface 1340 S(j|c) may generate a facet F(j|c), 1310, having one unique rectangular patch, even if there is a fault cutting reference horizon H(t(j)), 1350 approximated by infinite continuous surface 1340 S(j|c). Using the primal cookie cutter algorithm, the intersection of column K(c), 1290, with reference horizon H(t(j)), 1250, may generate a facet F(j|c), 1210 having one unique rectangular facet if reference horizon H(t(j)), 1250, is not cut by a fault in column K(c), 1290, and there may be no significant difference from using the dual cookie cutter algorithm in this case. However, if reference horizon H(t(j)), 1250, is cut by a fault in column K(c), 1290, using the primal cookie cutter algorithm, the intersection of column K(c), 1290, with reference horizon H(t(j)), 1250, may generate a facet F(j|c), 1210 having several polygonal facets. Thus, in the presence of faults, the dual cookie cutter algorithm, which in one embodiment always generates rectangular facets, may provide an advantage over the primal cookie cutter algorithm, which may generate polygonal facets with other than four sides.

Viewing a SGrid Generated by a the Dual-Cookie-Cutter Algorithm

For graphical purposes, each 3D hexahedral cell of a column K(c) may be marked with labels such as the following labels For example, a first label may correspond to an index, I(c), of the horizontal row of rectangles R(c) located in a plane P, a second label may correspond to an index, J(c), of the column of vertical rectangles R(c) located in the plane P, and a third label may correspond to the pseudo geological time or time range (t) corresponding to a center point of the cell. These labels may be used for example to enable geological scientists to explore cross sections and layers of stratigraphic grids generated using the dual cookie cutter algorithm according to the following mechanisms. For example, embodiments of the invention may provide an I-cross section, which may display substantially all cells sharing a same I(c) index. For example, embodiments of the invention may provide a J-cross section, which may display substantially all cells sharing a same J(c) index For example, embodiments of the invention may provide a layer, which may display a set of cells corresponding to a geological time (t) that substantially falls in a pseudo geological time range [t1,t2] or corresponding to a reference horizon that substantially falls between two successive reference horizons H(t1) and H(t2).

Generalizations of the Dual-Cookie-Cutter Algorithm

It may be appreciated by those skilled in the art that the dual cookie cutter algorithm may be generalized in various ways. The following may include examples of some, but not all, generalizations. For example, plane P (e.g., plane 900 and 1000) need not be horizontal and need not even be a plane. Plane P may include any continuous surface, S, that substantially approximates orientations of one or more reference horizons for the data or is approximately parallel to reference horizons, for example, including a Bezier patch or a triangulated surface. When geological horizons are substantially folded, such a generalization may be useful. For example, in such a case, a family of lines X and Y used to partition the plane, P, may be curvilinear and may be defined, for example, as a set of contour lines of a parametrization of the plane, P. In another example, primal and/or dual fibers may be smooth curves other than straight lines. For example, the fibers may be approximately vertical projection of a center point of a rectangular partition of the plane, P, oriented substantially parallel to a reference horizon for the data. For example, the fibers may be approximately tangent to a field of normal vectors of the horizons. An embodiment of the dual cookie cutter algorithm may be adapted to generate relatively smaller cells in neighbourhoods of faults or well paths (e.g., using local grid refinement methods). The pavement of the infinite continuous surface, S, generated using a family of rectangles R(c) (e.g., rectangles 910, 1015, 1115, and/or 1315 R(c)) may be replaced by a pavement including adjacent polygons whose vertices play the role of primal points and the centers the role of dual points. Other generalizations of the dual cookie cutter algorithm may be used.

Figure 14A:
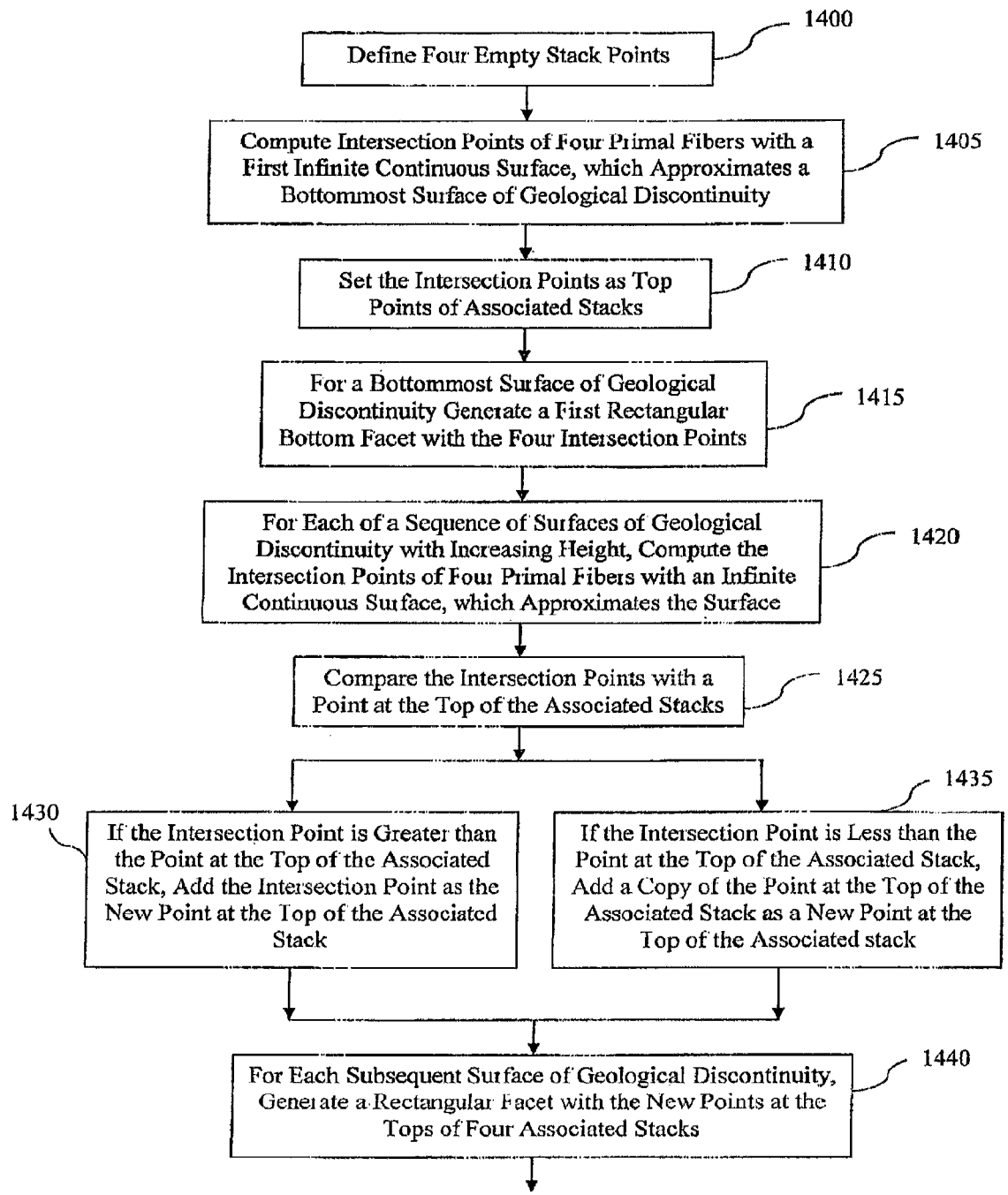
FIGS. 14a and 14b are flow diagrams of a method for partitioning a column into hexahedral cells according to an embodiment of the invention.
Figure 14B:
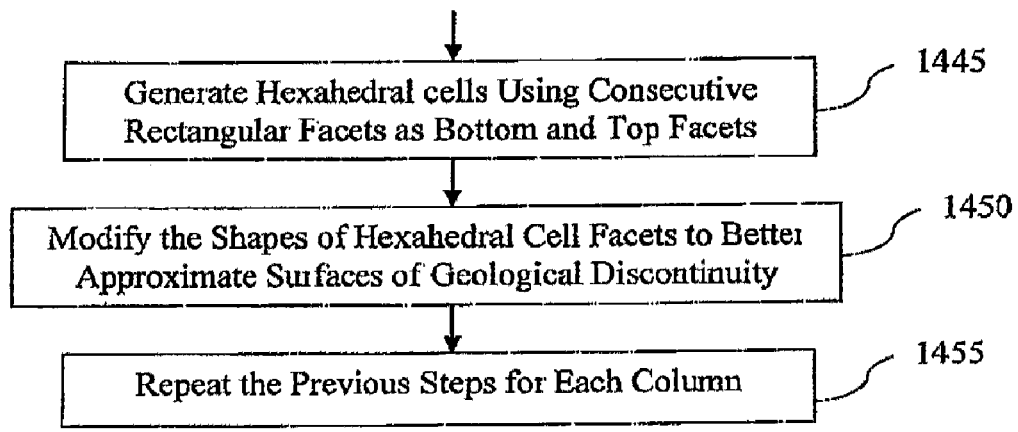

Reference is made to FIGS. 14*a* and 14*b*, which are flow diagrams of a method for, partitioning a column into hexahedral cells according to an embodiment of the invention. For example, methods described herein may include the cutting step or other related processes of the dual cookie cutter algorithm, according to an embodiment of the invention.

In operation 1400, for each column, K(c), four coordinates or empty stack points may be defined. The four coordinates may for example coincide with the four edges or primal fibers of the column, K(c), respectively. Any other suitable coordinates may be used.

In operation 1405, for the first infinite continuous surface, four points may be computed, which may be, for example, the intersections of each of the primal fibers with a first ordered infinite continuous surfaces, $S(1,c)$. The first ordered infinite continuous surface, $S(1,c)$, may be any suitable continuous surface extrapolated from the intersection of a dual fiber and surface of geological discontinuity such as a reference horizon, a fault, an unconformity, or any subsurface structure associated with, for example, substantially the relatively bottommost, earliest deposited, or deepest structure.

In operation 1410, each of the four intersection points may be set, for example, on top of an associated one of four stacks of the column K(c), respectively, as the top point.

In operation 1415, for the surface, a first substantially rectangular bottom facet may be generated, for example, with the four, intersection points as its vertices.

In operation 1420, for each of surfaces of faults, horizons, or other irregularities, subsequest to the first infinite continuous, four intersection points of primal the fibers, may be computed, for example, with the corresponding coincident infinite continuous surfaces.

In operation 1425, for each of the surfaces, each intersection point computed in operation 1420, may be compared, for example, with the point at the top of the associated stack.

In operation 1430, for each of the surfaces and each intersection point computed in operation 1420, if the intersection point is greater (e.g., along a primal fiber positively oriented in the vertical direction) than the point at the top of the associated stack, for example, the intersection point may be added, for example, as a new point at the top of the associated stack.

In operation 1435, for each of the surfaces and each intersection point computed in operation 1420, if the intersection point is less (e.g., along the corresponding primal fiber) than the point at the top of the associated stack, then a copy of the point at the top of the associated stack may be generated and add as a new point at the top of the associated stack. The new point may be slightly translated to be positioned above (e.g., along the corresponding primal fiber) (e.g., and relatively near) the intersection point computed in operation 1420.

In operation 1440, for each of the surfaces, a substantially rectangular, facet may be generated, for example, with each of the four new points at the top of the four stacks, as the vertices. Since the surfaces may be ordered, for example, according to the position in the geological space or time of deposition of the surfaces, an ordered set of facets corresponding to the ordering of the surfaces may be generated (e.g., $F(1,c), \ldots, F(j-1,c), F(j,c), \ldots, F(1,c)$), for example, each centered on, and approximately orthogonal to, the dual fiber.

In operation 1445, for each of the surfaces, a substantially hexahedral cell may be generated, for example, including a bottom rectangular facet, $F(j-1,c)$, and a top rectangular facet, $F(j,c)$. In some embodiments, the top facet, $F(j,c)$, and bottom facet, $F(j-1,c)$, may be connected by lateral quadrilateral facets. The lateral quadrilateral facets may be bound by edges that are respectively aligned with primal fibers and edges that may be shared by the facet.

In operation 1450, for each of the surfaces, if a center point of a facet substantially coincides with an intersection of a dual fiber, and a fault surface, then the shape of the hexahedral cell may be modified, for example, so that the facet better approximates the fault surface. For example, the facet and or the vertices of the facet may be moved so that the modified facet may be substantially parallel to the fault surface or a neighboring horizons. Such modifications of the facet may be avoided if the modified facet intersects other facets of a common hexahedral cell. Thus, a column K(c), may be partitioned or cut into 1–1 hexahedral cells, for each of the surfaces other than the first, where substantially each pair of adjacent hexahedral cell share a common facet having vertices that substantially intersect or lie on neighboring primal fibers.

Since the hexahedral cells may be constructed having a center point on a facet that corresponds to a surface of geological discontinuity (e.g., the intersection of a fault or unconformity and a dual fiber), surfaces of geological discontinuity may be approximated for example, in a stair step way. The surfaces of geological discontinuity may be sufficiently approximated by the hexahedral cells for example, if a suitable density of cells is used. Accordingly, the geological surfaces of discontinuity may be approximated in a stair step way without generating irregular cell structures having cells with additional (e.g., greater than six) surfaces.

Current flow simulator applications typically use cells having a side with a size ranging of from ten meters to 200 meters. Current models typically use millions of cells for modeling a geological structure. Other numbers and ranges may be used.

In operation 1455, the previous steps may be repeated for each column, K(c), corresponding to each dual point, c, or the set C or each dual fiber DF(c).

In some embodiments, the operations described hereinabove may be used for partitioning data for modelling a geological structure including laterally partitioning the data into multiple columns, where each column may be substantially laterally centered about a dual fiber and vertically partitioning each column at each of a plurality of the intersection points of a plurality of surfaces and the dual fiber about which the column may be substantially laterally centered.

In some embodiments, the operations described hereinabove may be used for partitioning a three-dimensional geological domain modelling a geological structure including partitioning the geological domain into multiple hexahedral cells, where at least a first surface of each of the hexahedral cells substantially may approximate a discontinuous surface in the geological structure and a second surface does not substantially approximate a discontinuous surface in the geological structure. In some embodiments, a plurality of adjacent hexahedral cells in a column K(c) may be merged.

In some embodiments, the operations described hereinabove may be used for partitioning a three-dimensional geological domain modelling a geological structure including generating a continuous surface that may approximate a surface of geological discontinuity in the geological structure and partitioning the geological structure into a plurality of hexahedral cells, where at least a portion of a surface of each of the hexahedral cells may include at least a portion of the continuous surface.

In some embodiments, the operations described hereinabove may be used for displaying a three-dimensional stratigraphic grid of a model of a geological structure, which may include displaying multiple hexahedral cells, where each of the hexahedral cells may include a reference point and may be laterally centered about an intersection point of a surface of geological discontinuity and a dual fiber. In some embodiments, the operations described hereinabove may be used for labelling a reference point of each of the hexahedral cells with an assigned pseudo geological time associated with the deposition of the sediments corresponding to the surfaces of geological discontinuity. In one embodiment, the reference point may a substantially central point of each of the hexahedral cells or a face thereof.

It may be appreciated by those skilled in the art that the operations described hereinabove may be adapted and modified.

Other or different operations may be used.

U.S. Pat. No. 4,821,164 to Swanson, U.S. Pat. No. 4,991,095 to Swanson, U.S. Pat. No. 5,844,564 to Bennis et al., U.S. Pat. No. 6,907,392 to Bennis et al., and U.S. Pat. No. 7,047,165 to Balaven et al.; U.S. Patent Publication Number 2005/0125203 to Hartman, Robert Petrus Adrianus; *Geomodeling*, by J. L. Mallet, Oxford University Press, 2002; and *Curves and Surfaces*, by G. Farin, Academic Press, 2002, ale all incorporated herein by reference in their entirety.

Figure 15:
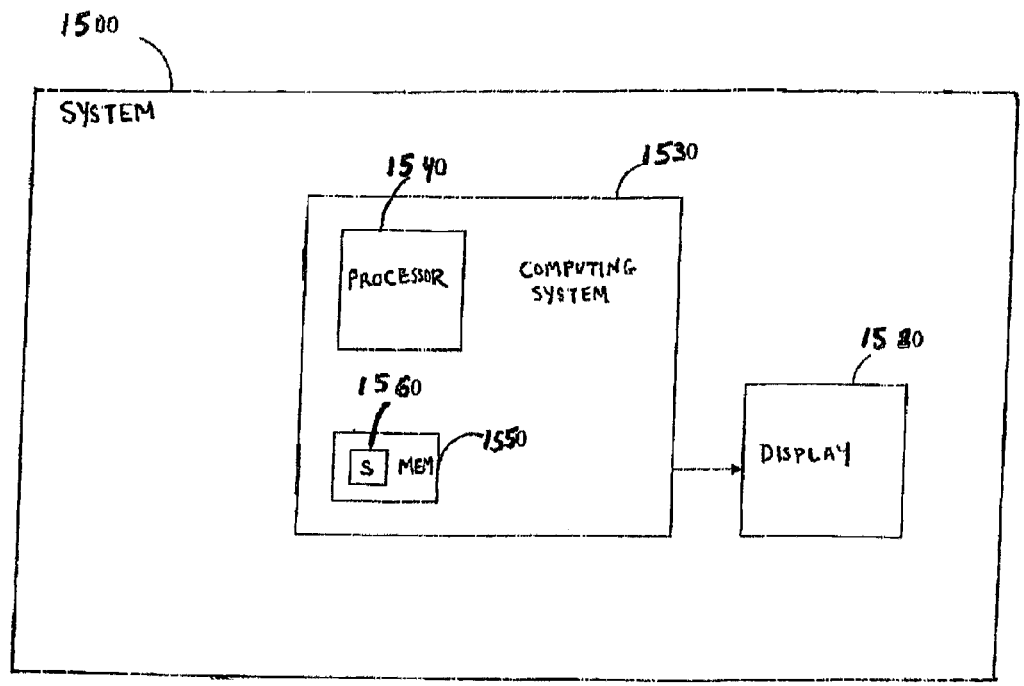
FIG. 15 is a schematic illustration of a system in accordance with an embodiment of the invention.
Figure 16A:
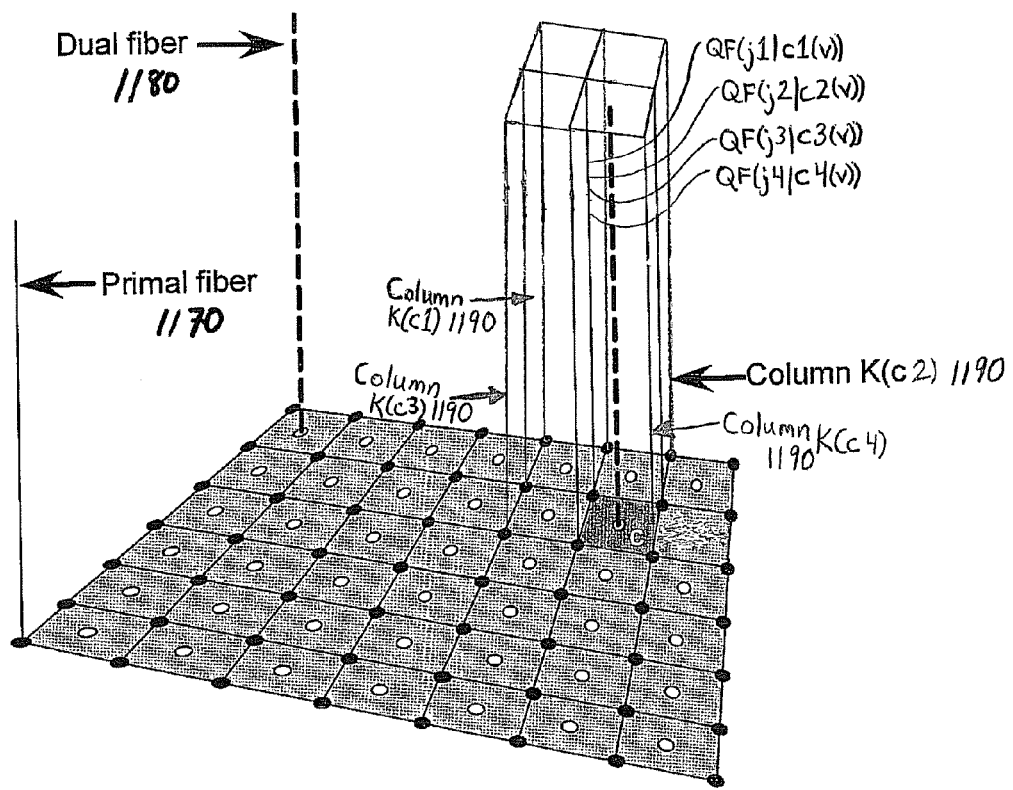
FIGS. 16A and 16B are schematic illustrations of four sibling stacks of four columns having incident cells in accordance with an embodiment of the invention.
Figure 16B:
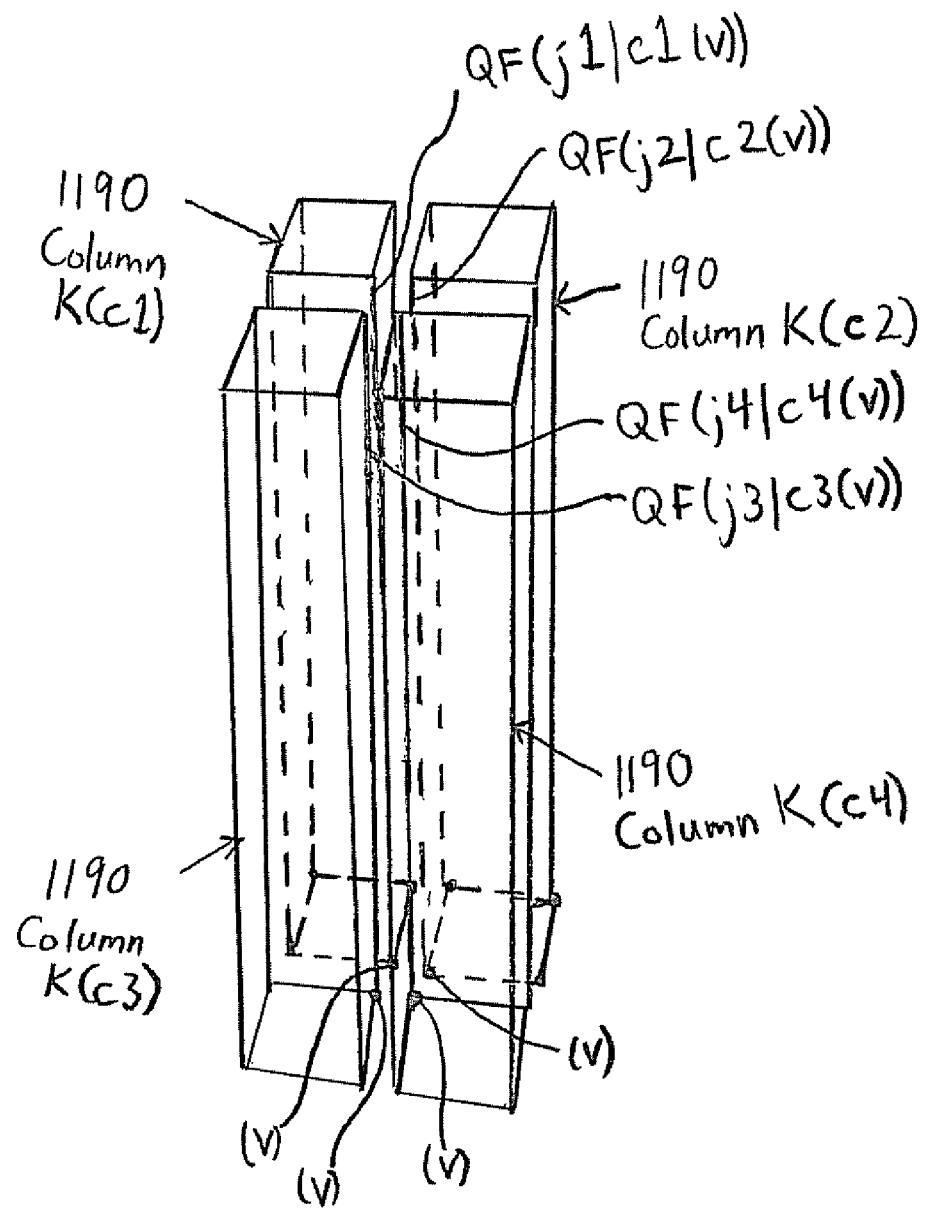

Reference is made to FIG. 15, which is a schematic illustration of a system in accordance with an embodiment of the invention. System 1500 may be used to partition data using a dual cookie cutter algorithm according to an embodiment of the invention. System 1500 may include a computing system 1530 and a display 1580.

Computing system 1530 may include for example processor 1540, memory 1550 and software 1560. Processor 1540 may process data, for example, raw or processed data. Memory 1550 may store data, for example, raw or processed data, ox software or instructions for carrying out embodiments of the present invention. Display 1580 may display data from computing system 1530 or any other suitable systems, devices, or programs, for example, a geo-modelling program or software. Display 1580 may include one or more inputs or outputs for displaying data from multiple data sources or to multiple displays. Display 1580 may display images produced from data.

Computing system 1530 may include, for example, any suitable processing system, computing system, computing device, processing device, computer, processor, or the like, and may be implemented using any suitable combination of hardware and/or software.

Processor 1540 may include, for example, one or more processors, controllers or central processing units ("CPUs"). Software 1560 may be stored, for example, all or in part, in memory 1550. Software 1560 may include any suitable software, for example, for partitioning, processing, or modeling geological data according to embodiments of the present invention. Processor 1540 may operate at least partially based on instructions in software 1560.

Computing system 1530 may be used for example to process geological data such as well data or seismic data. In the case of imaging in other areas, e.g., medical imaging, computing system 1530 may process other data such as, for example, ultrasound data, magnetic data, x-ray data, or other suitable data.

Embodiment of methods, mechanisms, or operations, of the present invention may be executed or operated by the system or components thereof, for example, described in reference to FIG. 15. Other systems and/or components may be used.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents ale possible in light of the above teaching. It is, therefore, to be understood that the appended claims are intended to cover all such modifications and changes as fall within the true spirit of the invention.

The invention claimed is:

1. A method for partitioning a model of a geological structure, the method comprising, in a processor:
    laterally partitioning the model into a plurality of columns, wherein each column is laterally centered about a center-line;
    for each column, generating a plurality of points representing the intersection of the center-line of the column and each of a plurality of geological surfaces representing horizons and faults; and
    at each of the plurality of intersection points of each column, vertically partitioning the column by generating a continuous surface which approximates the orientation of the geological surface at the intersection point:
        to generate a single facet at the intersection of the continuous surface and the column; and
        to partition the column into a plurality of hexahedral cells, whether or not the geological surface at the intersection point represents a horizon cut by a fault.

2. The method of claim 1, wherein laterally partitioning the data comprises generating a plurality of hexahedral cells laterally centered about a center-line.

3. The method of claim 1, wherein the center-line is a vertical projection of a center point of a polygonal partition of a plane oriented parallel to a reference horizon for the model.

4. The method of claim 3, wherein the polygonal partition is a rectangular partition.

5. The method of claim 1, wherein the center-line is a vertical projection of a center point of a rectangular partition of a curved surface that approximates the orientation of a reference horizon for the model.

6. The method of claim 1, wherein the continuous surface at each intersection point is an infinite continuous surface.

7. The method of claim 1, wherein the geological surface is approximated in a stair step way.

8. The method of claim 1, wherein a geological surface represents an unconformity.

9. The method of claim 1, further comprising merging collocated points and collocated vertical faces of adjacent columns.

10. A system for partitioning a model of a geological structure, the system comprising:
    a processor for laterally partitioning the model into a plurality of columns, wherein each column is laterally centered about one of a plurality of center-lines, for each column, generating a plurality of points representing the intersection of the center-line of the column and each of a plurality of geological surfaces representing horizons and faults, and at each of the plurality of intersection points of each column, vertically partitioning the column by generating a continuous surface which approximates the orientation of the geological surface at the intersection point:
  to generate a single facet at the intersection of the continuous surface and the column; and
  to partition the column into a plurality of hexahedral cells, whether or not the geological surface at the intersection point represents a horizon cut by a fault; and
a display for visualizing the partitioned model.

11. The system of claim 10, wherein the continuous surface at each intersection point is an infinite continuous surface.

12. The system of claim 10, wherein a geological surface represents an unconformity.

13. The system of claim 10, wherein the processor merges collocated points and collocated vertical faces of adjacent columns.

14. The system of claim 10, wherein the display visualization includes a reference point of each of the cells labeled with an assigned pseudo geological time associated with the deposition of the sediments corresponding to the geological surfaces.

15. The method of claim 1, comprising labelling a reference point of each of the cells with an assigned pseudo geological time associated with the deposition of sediments corresponding to the geological surfaces.

16. The method of claim 1, wherein the center-lines are dual fibers that are parallel straight lines approximately orthogonal to a geological surface and launched from the centers of a rectangular mesh.

17. The system of claim 10, wherein the processor labels a reference point of each of the cells with an assigned pseudo geological time associated with the deposition of sediments corresponding to the geological surfaces.

18. The system of claim 10, wherein the center-lines are dual fibers that are parallel straight lines approximately orthogonal to a geological surface and launched from the centers of a rectangular mesh.

19. The method of claim 1, wherein the single facet is rectangular.

20. The system of claim 10, wherein the single facet is rectangular.

* * * * *